(12) United States Patent
Matsuda et al.

(10) Patent No.: US 6,479,212 B1
(45) Date of Patent: Nov. 12, 2002

(54) PHOTOSENSITIVE RESIN, RESIST COMPOSITION USING THE PHOTOSENSITIVE RESIN, PATTERN FORMATION METHOD USING THE RESIST COMPOSITION, DEVICE PRODUCED BY THE PATTERN FORMATION METHOD, AND EXPOSURE METHOD

(75) Inventors: Minoru Matsuda, Sendai; Hiroshi Maehara, Yokohama; Keita Sakai, Utsunomiya, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 46 days.

(21) Appl. No.: 09/630,187

(22) Filed: Aug. 1, 2000

(30) Foreign Application Priority Data

Aug. 5, 1999 (JP) ............................................. 11-221868
Jul. 28, 2000 (JP) ........................................ 2000-229478

(51) Int. Cl.$^7$ ......................... C03F 7/004; C08G 75/20; C08F 283/00
(52) U.S. Cl. .................... 430/270.1; 430/905; 430/910; 430/5; 430/296; 430/311; 430/325; 525/536; 528/382; 528/364; 528/373; 528/376
(58) Field of Search ........................ 430/270.1, 5, 296, 430/311, 324, 325, 905, 910; 525/536; 528/382, 364, 373, 376

(56) References Cited

U.S. PATENT DOCUMENTS

| 3,313,785 | A | * | 4/1967 | Zutty et al. ................. 260/79.3 |
| 3,898,350 | A | * | 8/1975 | Gipstein et al. ............... 427/43 |
| 3,985,915 | A | * | 10/1976 | Gipstein et al. ............... 427/43 |
| 4,262,073 | A | * | 4/1981 | Pampalone et al. ........... 430/18 |
| 4,397,938 | A | * | 8/1983 | Desai et al. ................. 430/296 |
| 4,540,719 | A | * | 9/1985 | Loomis ....................... 521/89 |
| 4,751,168 | A | * | 6/1988 | Tsuchiya et al. ............. 430/272 |
| 4,965,340 | A | * | 10/1990 | Matsuda ...................... 528/382 |
| 4,985,332 | A | * | 1/1991 | Anderson et al. ........... 430/176 |
| 5,585,222 | A | | 12/1996 | Kaimoto et al. ............. 430/296 |
| 6,225,019 | B1 | * | 5/2001 | Matsuda et al. .......... 430/270.1 |

FOREIGN PATENT DOCUMENTS

| EP | 0 915 384 | 5/1999 |
| EP | 0 935 172 | 8/1999 |
| EP | 0 939 343 | 9/1999 |
| JP | 5-80515 | 4/1993 |
| JP | 5-265212 | 10/1993 |
| JP | 11-286549 | 10/1999 |

* cited by examiner

*Primary Examiner*—Janet Baxter
*Assistant Examiner*—Yvette M. Clarke
(74) *Attorney, Agent, or Firm*—Fitzpatrick, Cella, Harper & Scinto

(57) ABSTRACT

There is provided a photosensitive resin having at least three moieties in the backbone chain, two moieties of which moieties are an alicyclic group moiety and a sulfonyl moiety. The photosensitive resin has a superior solubility in solvents and a superior dry-etching resistance, and enables easy fabrication of highly integrated semiconductor devices.

20 Claims, 9 Drawing Sheets

PHOTOSENSITIVE RESIN, RESIST COMPOSITION USING THE PHOTOSENSITIVE RESIN, PATTERN FORMATION METHOD USING THE RESIST COMPOSITION, DEVICE PRODUCED BY THE PATTERN FORMATION METHOD, AND EXPOSURE METHOD

BACKGROUND OF THE INVENTION

1. Field of the Invention

This invention relates to a photosensitive resin having high sensitivity and high resolution performances to electromagnetic waves such as ultraviolet light, far ultraviolet light, vacuum ultraviolet light and X-radiation, or charged particles such as electron rays and ion beams, a resist composition making use of such a photosensitive resin, a pattern formation method making use of the resist composition, and also a device produced by the pattern formation method. This invention relates to an exposure method making use of the resist composition.

2. Related Background Art

In recent years, with a progress of scale-down in semiconductor devices such as integrated circuits and display devices or in masks for exposure, their pattern line width has tendency to be reduced. In microfabrication, light in the region of from near ultraviolet to far ultraviolet is used as exposure light, and processing is carried out in wavelength regions (600 to 248 nm) of such light.

At present, however, the reduction of line width is approaching a limit. For a further reduction of line width, it is attempted to use light having much shorter wavelength. Then, in recent years, lithographic techniques using as an exposure light source an ArF excimer laser of 193 nm in wavelength or an $F_2$ laser of 157 nm in wavelength are gone ahead with development.

Achievement of such a shorter wavelength for the wavelength of exposure light brings about a very important problem that resists have a low transmittance to exposure light to cause a deterioration of pattern resolution performance. Especially in photolithography using the ArF excimer laser as a light source, in view of light transmittance it is very difficult to use novolak resin or polyvinyl phenol having been used in conventional resists, because either has an aromatic ring in the structure and this aromatic ring has a very high light absorption. Meanwhile, the light transmittance to exposure light is known to be greatly improved by the use of a fatty acid polymer.

However, resists making use of such a fatty acid polymer commonly have a poor resistance to dry etching carried out when the substrate is processed after a pattern is formed. Accordingly, resists making use of a polymer having an alicyclic group in the polymer side chain have been brought forth. For example, such resists may include those making use of a norbornene-methacrylate copolymer or adamantyl methacrylate. The resists making use of such polymers are disclosed in, e.g., Japanese Patent Application Laid-Open No. 5-80515 and No. 5-265212.

A photosensitive resin further having an alicyclic group in the backbone chain is also disclosed in J. Photopolymer Science and Technology, 11 (3) 481 (1998).

However, the polymers having an alicyclic group commonly have so low a solubility in solvents and developing solutions that it has been difficult to obtain resists having a high performance or it has been difficult to control molecular weight and molecular weight distribution when the polymers are synthesized.

To solve the above problems, as disclosed in Japanese Patent Application No. 10-24367 it is proposed to solve the above problems by using a polymer represented by the following formula, having a moiety which has an alicyclic group for improving dry-etching resistance and transparency, a moiety which cleaves in the presence of an acid to improve the solubility in developing solutions and a moiety which improves the solubility in solvents.

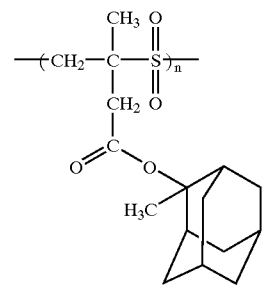

SUMMARY OF THE INVENTION

An object of the present invention is to solve the problem discussed above, and provide a photosensitive resin having a superior solubility in solvents and a superior dry-etching resistance and enabling easy fabrication of highly integrated semiconductor devices; and a resist composition making use of the photosensitive resin, a pattern formation method making use of the resist composition, a device produced by the pattern formation method, and an exposure method.

To achieve the above object, the present invention provides a photosensitive resin having at least three moieties in the backbone chain, two moieties of which moieties are an alicyclic group moiety and a sulfonyl moiety. The photosensitive resin may further has a vinyl monomer moiety in the backbone chain.

The present invention also provides a resist composition comprising the above photosensitive resin and a solvent for dissolving the photosensitive resin.

The present invention still also provides a pattern formation method comprising the steps of coating the above resist composition on the surface of a substrate to form a resist film, exposing the resist film to light, and developing the resist film thus exposed.

The present invention further provides a device produced by the above pattern formation method.

The present invention still further provides an exposure method of exposing a resist having the above photosensitive resin.

The photosensitive resin of the present invention has a alicyclic group moiety and a sulfonyl moiety which stand copolymerized, and hence responses sensitively upon external stimulation by light to cleave at the part between the both moieties. Also, where the photosensitive resin of the present invention has a vinyl monomer moiety in the backbone chain, the dry-etching resistance is improved.

DESCRIPTION OF THE PREFERRED EMBODIMENTS

Figure 1:
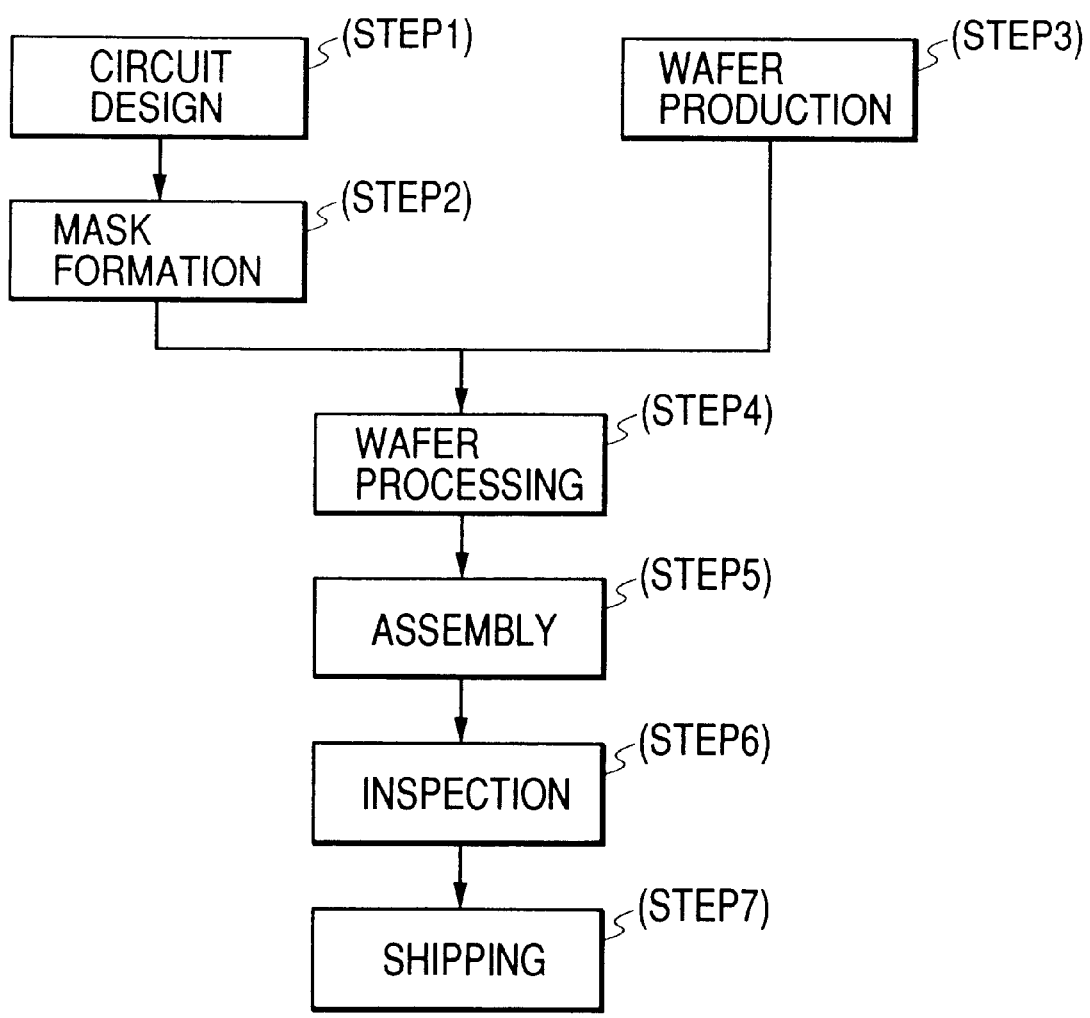
FIG. 1 is a flow chart of a process for producing a semiconductor device according to the present invention.

The present invention will be described below in detail.

The present invention is a photosensitive resin having at least three moieties in the backbone chain, two moieties of which moieties are an alicyclic group moiety and a sulfonyl moiety, and is preferably a photosensitive resin in which at least one of the other moieties of which is a vinyl monomer moiety.

First, the photosensitive resin according to this embodiment has an alicyclic group moiety in the backbone chain in order to improve dry-etching resistance. Second, it has a sulfonyl moiety in the backbone chain chiefly in order to improve the sensitivity of the photosensitive resin. The sulfonyl moiety not only contributes to the improvement in sensitivity but also influences the solubility in solvents when used as a resist. Also, as a third structure, it has in the backbone chain a moiety of a type different from these moieties, i.e., a vinyl monomer moiety. This vinyl monomer moiety is useful for the controlling of molecular weight and molecular weight distribution when a polymer is synthesized, and also for the controlling of glass transition temperature of the polymer synthesized, i.e., heat resistance of the resist. Namely, characteristic features exhibited as a high polymer can be improved. Also, even when, e.g., a side chain changes chemically, the backbone chain itself may hardly be affected by such chemical change of the side chain because the alicyclic group has been introduced in the backbone chain, and also this brings about an improvement in dry-etching resistance. For example, the backbone chain can be prevented from turning low-molecular weight. This is presumably because the photosensitive resin of the present invention has a high carbon density in its backbone chain.

Chemical structures the polymer having these three moieties in the backbone chain may have are shown below.

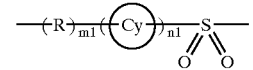

wherein R represents an acrylate or a methacrylate; Cy represents a monocyclic or polycyclic alicyclic group; and m1 and n1 each represent a positive real number. In the polymer having three moieties in the backbone chain according to the present embodiment, one sulfonyl moiety may be directly bonded to alicyclic group (Cy) at its one side, and may be directly bonded to another sulfonyl moiety at the other side.

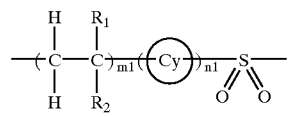

wherein $R_1$ represents a hydrogen atom, a methyl group or a halogen atom; $R_2$ represents an alkyl group having 1 to 8 carbon atoms, a functional group in which part of hydrogen atoms of the alkyl group has been substituted with a halogen atom, or a functional group containing an aromatic ring or an alicyclic group; Cy represents a monocyclic or polycyclic alicyclic group; and m1 and n1 each represent a positive real number.

The polymer may also have a structure as shown below, which has the sulfonyl moiety between the vinyl monomer moiety and the alicyclic group moiety.

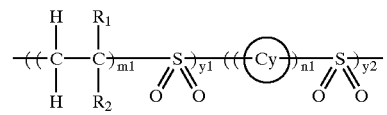

wherein $R_1$ represents a hydrogen atom, a methyl group or a halogen atom; $R_2$ represents an alkyl group having 1 to 8 carbon atoms, a functional group in which part of hydrogen atoms of the alkyl group has been substituted with a halogen atom, or a functional group containing an aromatic ring or an alicyclic group; Cy represents a monocyclic or polycyclic alicyclic group; and m1, n1, y1 and y2 each represent a positive real number.

Examples of compounds usable as Cy are shown below.

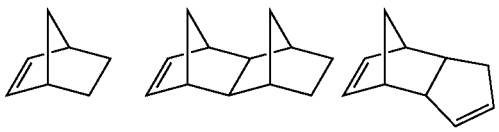

As the vinyl monomer moiety, commonly usable are vinyl monomers such as ethylene, propylene, butene, pentene and hexene; acrylic monomers such as methyl acrylate, ethyl acrylate, butyl acrylate and 2-ethylhexyl acrylate, or derivatives thereof including compounds such as 2-hydroxyethyl acrylate, α-chloroethyl acrylate and α-chlorotrifluoroethyl acrylate; methacrylic monomers such as methyl methacrylate; and styrene, and styrene derivatives such as α-methylstyrene, methylstyrene, methoxystyrene, chloromethylstyrene and hydroxystyrene.

As for the vinyl monomer moiety, it may have an alicyclic group or an aromatic ring in the side chain for the purpose of improving dry-etching resistance and heat resistance. Especially when a far ultraviolet or vacuum ultraviolet light source such as an ArF excimer laser is used as a light source for patterning, it is preferable for the transmittance of exposure light to be higher. For this end, the vinyl monomer moiety may preferably have any of alicyclic groups as shown below.

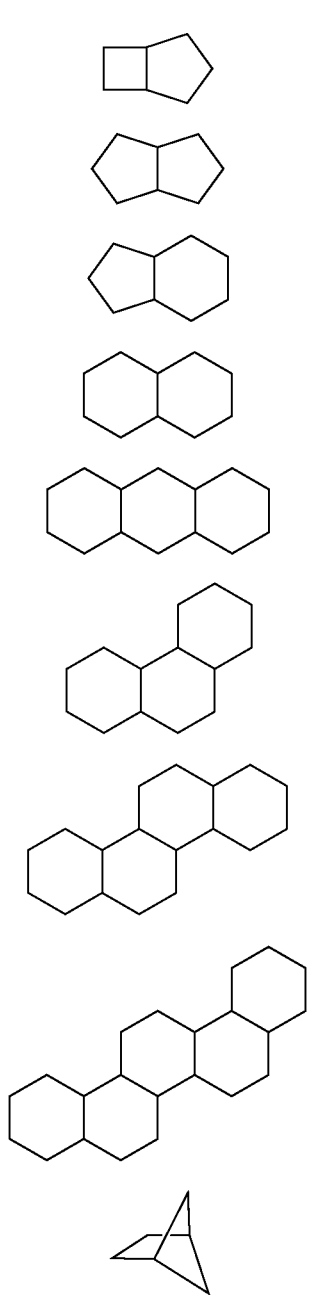

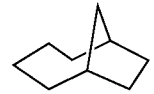
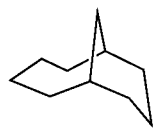
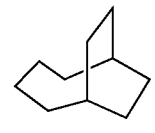
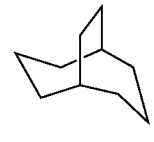
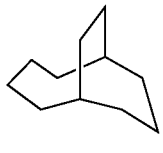
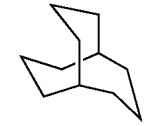

(w) 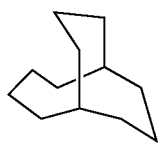

(x) 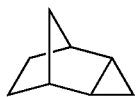

(y) 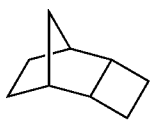

(z) 

(aa) 

(ab) 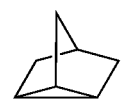

(ac) 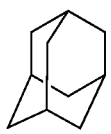

(ad) 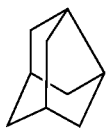

(ae) 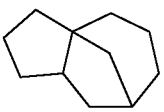

(af) 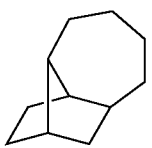

The photosensitive resin of the present invention may also have on a side chain a functional group that is cleavable by an acid. As an example thereof, a chemical structural formula a polymer having on the side chain a tertiary-butoxycarbonyl (t-BOC) group that is cleavable by an acid may have is shown below.

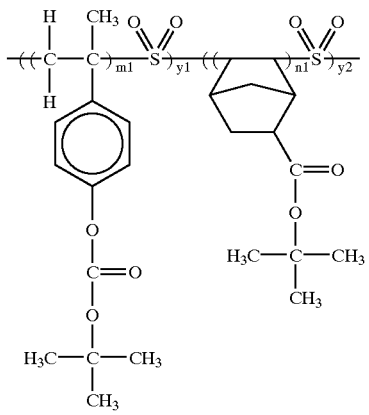

The (t-BOC) group is decomposed by an acid in the manner as shown below.

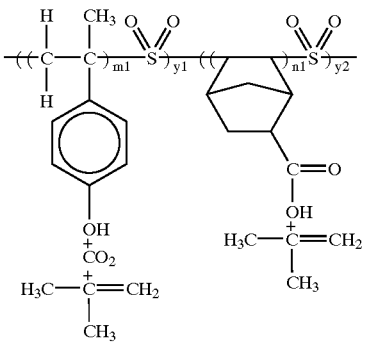

Besides this, an acetal group is also usable as the functional group that is cleavable by an acid.

As the solvent used to prepare the resist composition making use of the photosensitive resin of the present invention, usable are commonly available solvents including alkoxyl ethanols such as methyl cellosolve, ethyl cellosolve and butyl cellosolve; cellosolve acetates such as methyl cellosolve acetate, ethyl cellosolve acetate and butyl cellosolve acetate; propylene glycol acetates such as propylene glycol monomethyl acetate; lactates such as ethyl lactate; aliphatic ketones such as methyl ethyl ketone, 2-pentanone, methyl isobutyl ketone and methyl isoamyl ketone, alicyclic ketones such as cyclohexanone and N-methylpyrrolidone; and aromatic compounds such as benzene, toluene, xylene and chlorobenzene; any of which may be used alone or in the form of a mixture.

For the purpose of controlling solubility in these solvents and vapor pressure, the solvent may be mixed with an alcohol such as methyl alcohol, ethyl alcohol, n-propyl alcohol or isopropyl alcohol; an alkane such as pentane, hexane, heptane or octane; or an alicyclic compound such as cyclopentane or cyclohexane.

For the purpose of controlling coating performance on substrates, an anionic, cationic or ampholytic surface-active agent or a fluorine type surface-active agent may also be mixed.

In order to further improve storage stability of the resist, it is also possible to add a monophenol compound such as phenol, cresol, methoxyphenol or 2,6-di-t-butyl-p-cresol, a bisphenol compound such as 2,2'-methylenebis(4-methyl-6-t-butylphenol), a high-molecular phenolic compound such as 1,1,3-tris(2-methyl-4-hydroxy-5-t-butylphenyl)butane, a sulfur type antioxidant such as dilauryl-3,3'-thiodipropionate, a phosphorus type antioxidant such as triphenyl phosphate, or an antioxidant such as sorbic acid, erythorbic, isopropyl citrate or nordihydroguaiaretic acid.

Concentration of the photosensitive resin in a resist solution is controllable depending on the desired film thickness on the substrate. It may preferably be approximately from 1% by weight to 50% by weight, and preferably from 3% by weight to 30% by weight.

The photosensitive resin of the present invention may also be used as a solution type resist composition composed chiefly of the polymer described above. It may also be used as what is called a chemically amplified resist, in combination with a suitable acid generator capable of generating an acid upon irradiation by electromagnetic waves or charged particles. As preferable acid generators, usable are iodonium salts such as diphenyliodonium hexafluoroantimonate represented by (1) and sulfonium salts such as triphenylsulfonium trifluoromethyl sulfonate represent by (2).

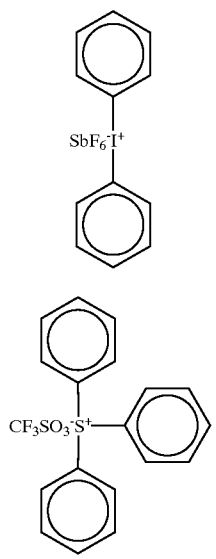

The acid generator to be added may be used alone, or a plurality of acid generators may be used in combination. The acid generator may preferably be added in an amount of from 0.1% by weight to 20% by weight, and preferably from 1% by weight to 10% by weight.

The photosensitive resin of the present invention may also be used as a resist made up in combination with an additional alkali-soluble resin. The photosensitive resin of the present invention acts in itself as a dissolution inhibitor of the additional alkali-soluble resin when exposed to high-energy charged particles or electromagnetic waves such as electron rays, ion beams or X-radiation, and, with further addition of a suitable acid generator (photoacid generator) such as the acid generator (1) or (2), can also be made to act as a dissolution inhibitor of the additional alkali-soluble resin when exposed to electromagnetic waves such as ultraviolet rays.

As usable alkali-soluble resins, novolak resin and polyvinyl phenol represented by (3) and (4), respectively, having been used in conventional resists may be used. Also, in lithography carried out using a short-wavelength light source such as an argon fluoride excimer laser, it is desirable to use an alkali-soluble resin having an alicyclic group, such as a polyglutaraldehyde or cellulose derivative.

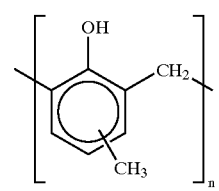

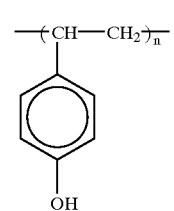

As a way of the use in combination with the additional alkali-soluble resin as shown above, the photosensitive resin may be used in combination with an alkali-soluble silicon-containing polymer. As the alkali-soluble silicon-containing polymer, a ladder siloxane polymer represented by the following formula may be used.

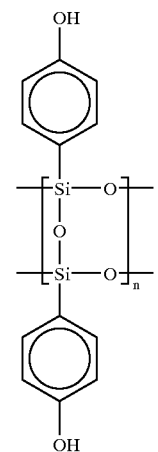

Thus, the resist made up in combination with such a silicon-containing polymer can be used as what is called a multi-layer resist, and is also effective against the exposure light wavelength being made shorter and against any lowering of focal depth that may occur as optical systems are made to have a higher NA (numerical aperture).

As described above, the photosensitive resin of the present invention may be used as the resist making use of it alone, as the chemically amplified resist made up in combination with a photo-acid-generator, as the resist made up in combination with an additional alkali-soluble resin, and also as the multi-layer resist made up in combination with a silicon-containing polymer. Also, some combination of these enables optimum combination with exposure light wavelengths.

Figure 6:
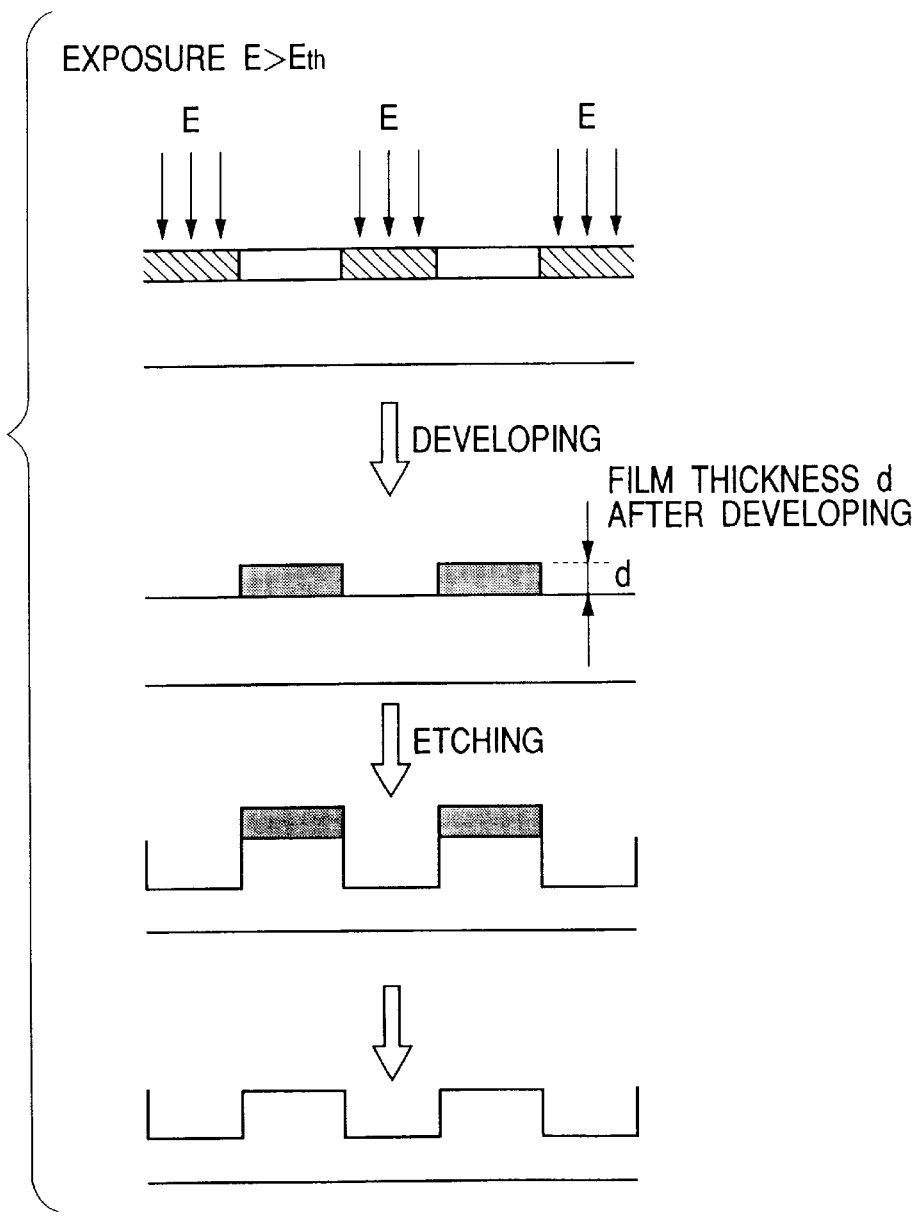
FIG. 6 illustrates pattern formation by developing.

FIG. 6 is a schematic diagram to show how the lithography pattern is formed through the development and etching process where the above exposure is carried out. In the present embodiment the photolithography pattern or the exposure pattern hereinafter means a pattern composed of portions where the resist thickness is 0 because of the exposure over the exposure threshold Eth and portions where the resist remains because of the exposure not more than Eth.

Figure 7:
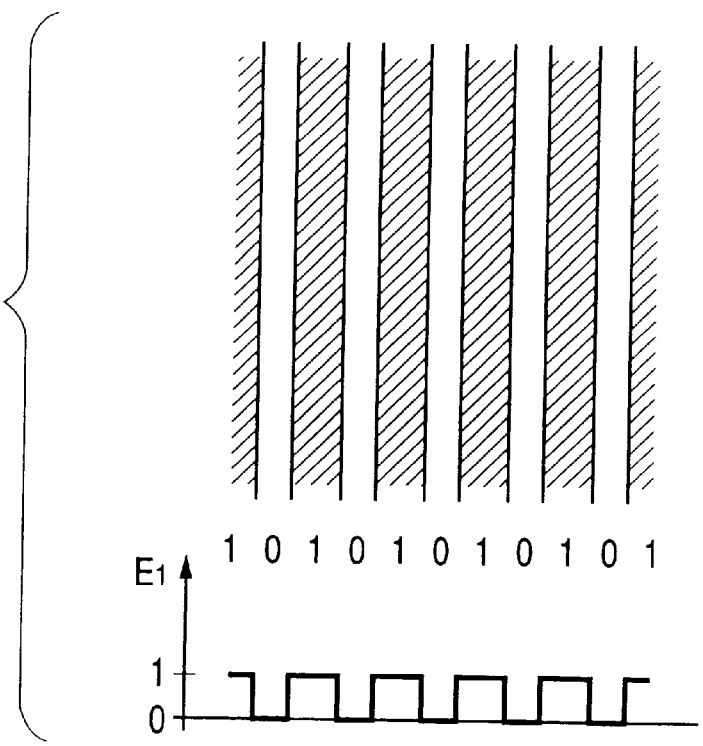
FIG. 7 illustrates a periodic pattern (exposure pattern) obtained by conventional two-beam interference exposure.
Figure 8:
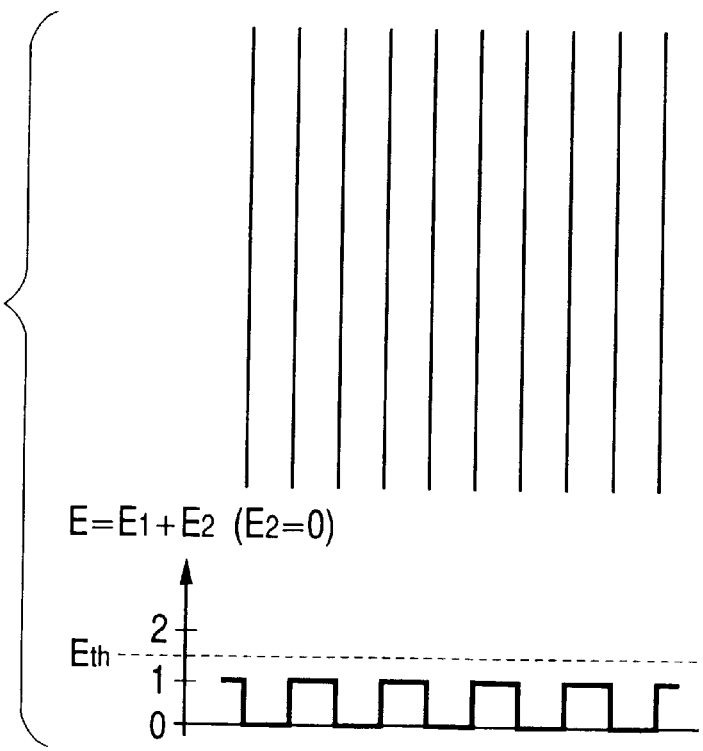
FIG. 8 illustrates a periodic pattern (exposure pattern) obtained by two-beam interference exposure according to the present invention.

In the present embodiment, supposing the maximum exposure dose in the periodic pattern exposure (two-beam interference exposure) to provide the image with the high contrast is 1, the threshold value Eth of the resist of the photosensitive substrate is set to be larger than 1, as illustrated in FIG. 7 (which is the same figure as FIG. 4A) and FIG. 8, different from the normal exposure sensitivity setting of FIGS. 4A, 4B to FIG. 6. When this photosensitive substrate is subjected to only the periodic pattern exposure illustrated in FIGS. 4A and 4B and the exposure pattern (exposure dose distribution) of the resist thereof is developed, the exposure dose is insufficient and there appears no portion having the thickness of 0 after the development, though there are some thickness variations. Therefore, the so-called lithography pattern of projections and depressions is not formed by etching. This can be regarded as disappearance of the periodic pattern. In FIG. 8, the upper part shows the lithography pattern (in which there is nothing formed though there are a plurality of thin lines drawn) and the graph of the lower part shows the relation between the exposure dose distribution and the exposure threshold Eth in the resist. In the lower part, $E_1$ represents the exposure dose in the periodic pattern exposure used in the double exposures and $E_2$ the exposure dose in the normal exposure used in the double exposures.

The feature of the present embodiment is that the double exposures (or triple or more exposures) achieve fusion of the exposure pattern by the periodic pattern image of high resolution, which seems disappearing with only the periodic pattern exposure, with the exposure pattern by the circuit pattern image of an arbitrary shape including the pattern (image) of the size not more than the resolving power of exposure apparatus by the normal exposure, to selectively expose only desired areas at the exposure dose not less than the exposure threshold Eth of the resist, thereby forming the desired lithography pattern finally.

Figure 9A:
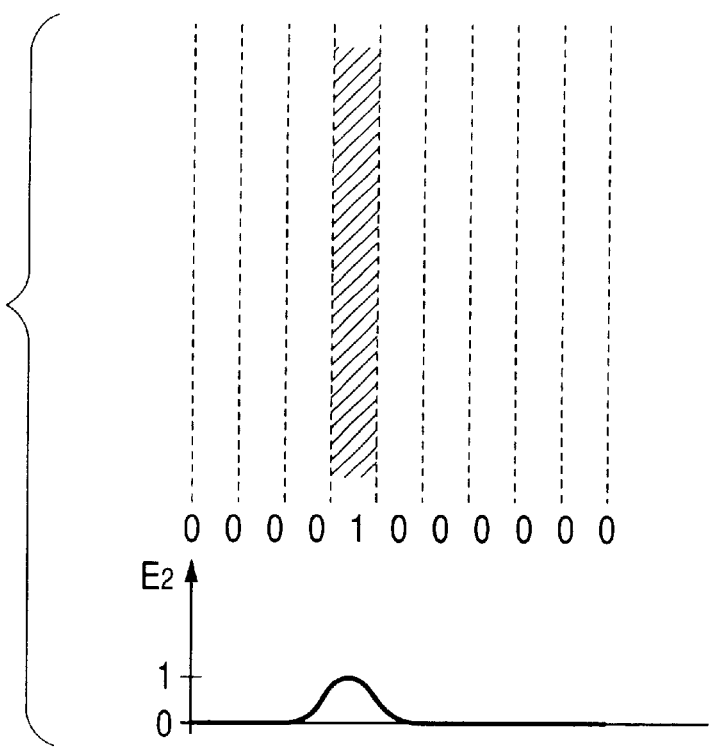
FIGS. 9A and 9B illustrate an example of exposure patterns (lithography patterns) which can be formed in an embodiment of the present invention.

FIG. 9A shows the exposure pattern by the normal exposure, in which a microscopic circuit pattern below the resolving power of projection exposure apparatus cannot be resolved and the intensity distribution of the pattern image on the exposed object or the exposure dose distribution of the resist by this pattern image spreads unsharply.

The mask pattern forming the exposure pattern of FIG. 9A is a microscopic pattern having a linewidth equal to approximately half of the linewidth that can be resolved by the normal projection exposure (which can achieve the desired contrast).

Figure 9B:
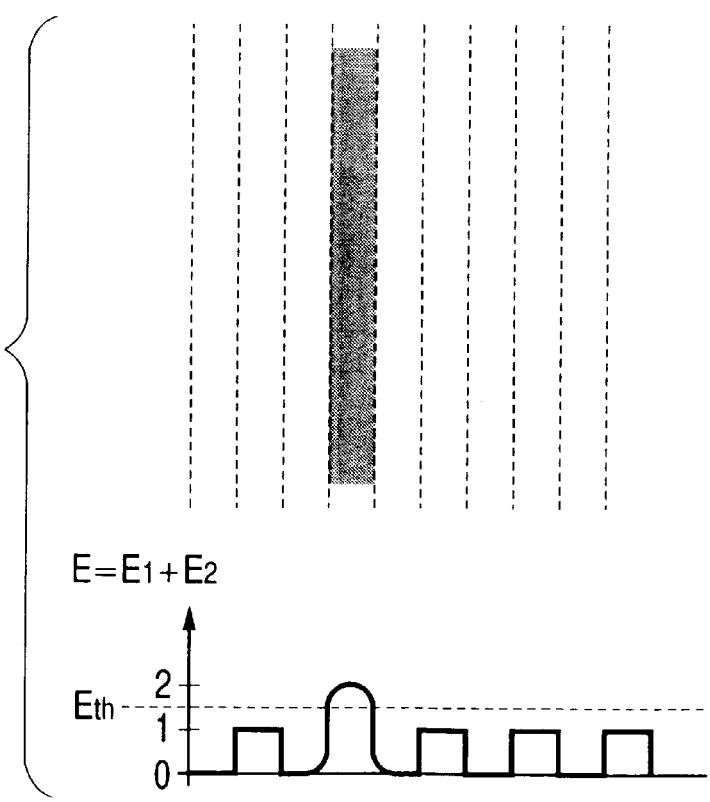

Supposing that after the periodic pattern exposure of FIG. 7 and without carrying out the development step, the projection exposure to form the exposure pattern of FIG. 9A is carried out as superimposed in the same region or at the same exposure position of the same resist, the total exposure dose distribution of this resist is as shown in the graph in the lower part of FIG. 9B. Since the ratio of the exposure dose $E_1$ of the periodic pattern exposure to the exposure dose $E_2$ of the projection exposure is 1:1 and the exposure threshold Eth of the resist is set between the exposure dose $E_1$ (=1) of the periodic pattern exposure and the sum (=2) of the exposure dose $E_1$ and the exposure dose $E_2$ (=1) of the exposure of the normal circuit pattern, the lithography pattern shown in the upper part of FIG. 9B is formed. On that occasion the center of the exposure pattern of the normal exposure is aligned with the peak of the exposure pattern of the periodic pattern exposure and the isolated line pattern shown in the upper part of FIG. 9B has the resolution equivalent to that of the periodic pattern exposure and does not include the simple periodic pattern. Therefore, the pattern is obtained in the high resolution over the resolution that can be implemented by the normal projection exposure.

Figure 10A:
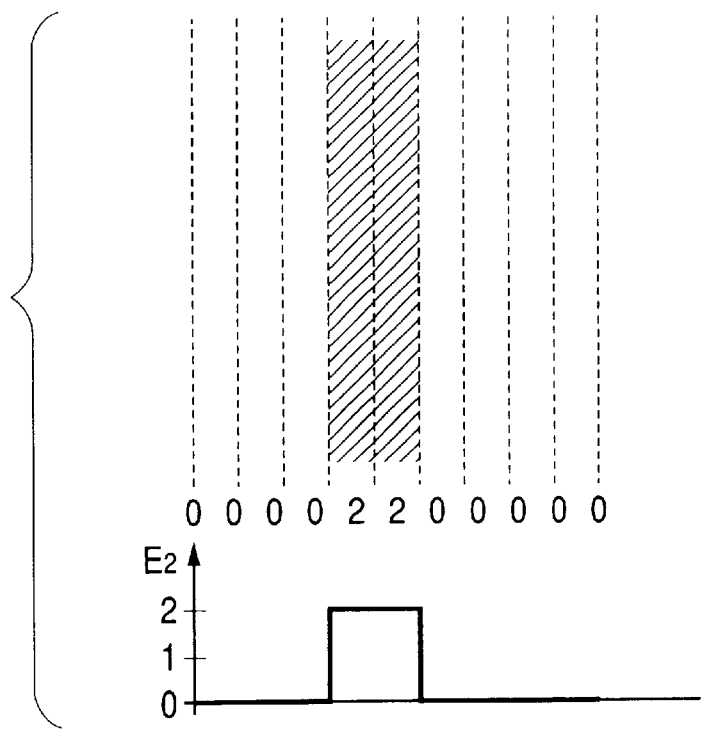
FIGS. 10A and 10B illustrate another example of exposure patterns (lithography patterns) which can be formed in an embodiment of the present invention.
Figure 10B:
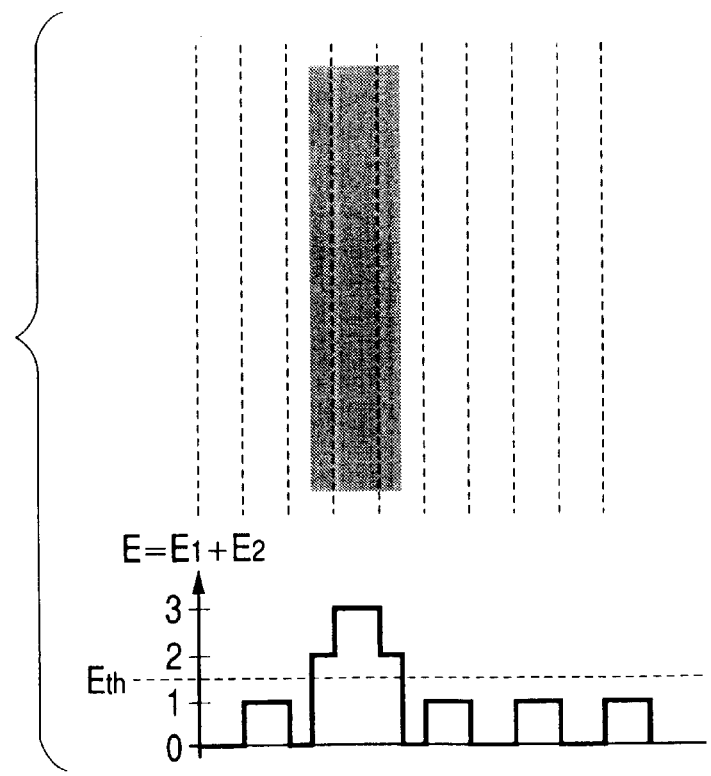

Supposing that after the periodic pattern exposure of FIG. 7 and without carrying out the development step, the normal projection exposure to form the exposure pattern of FIGS. 10A and 10B (projection exposure over the exposure threshold Eth (i.e., projection exposure at the exposure dose equal to double the threshold herein) in a linewidth that can be resolved with a high contrast, the linewidth being double that of the exposure pattern of FIG. 7) is carried out as superimposed in the same region or at the same exposure position of the same resist (while the center of the exposure pattern by the normal projection exposure is aligned with the center or the peak of the exposure pattern of the periodic pattern exposure whereby a good synthetic image or synthetic exposure pattern is obtained with good symmetry of the synthetic image or the synthetic exposure pattern obtained by superposition), the total exposure dose distribution of this resist becomes as illustrated in FIG. 10B, in which the exposure pattern of the two-beam interference exposure disappears and only the lithography pattern by the projection exposure is formed finally.

Figure 11A:
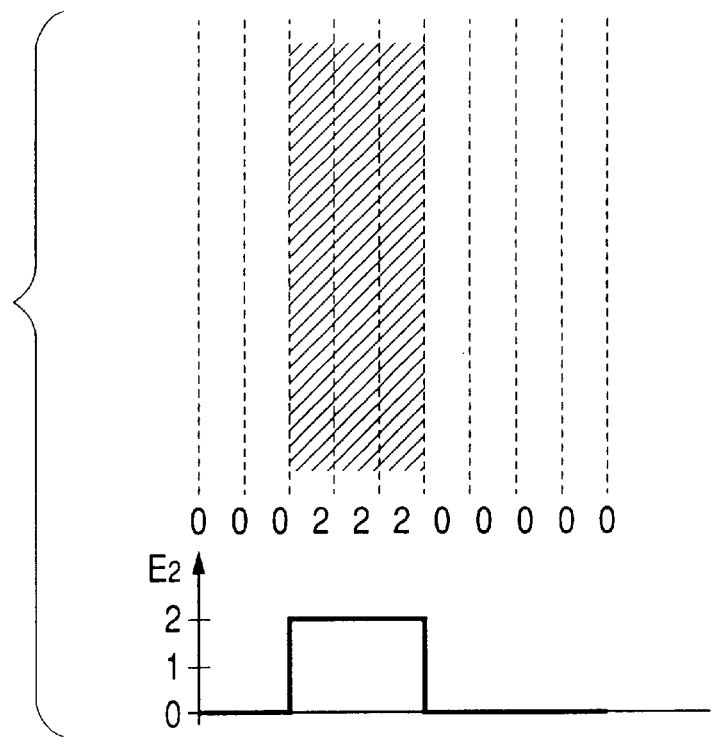
FIGS. 11A and 11B illustrate still another example of exposure patterns (lithography patterns) which can be formed in an embodiment of the present invention.
Figure 11B:
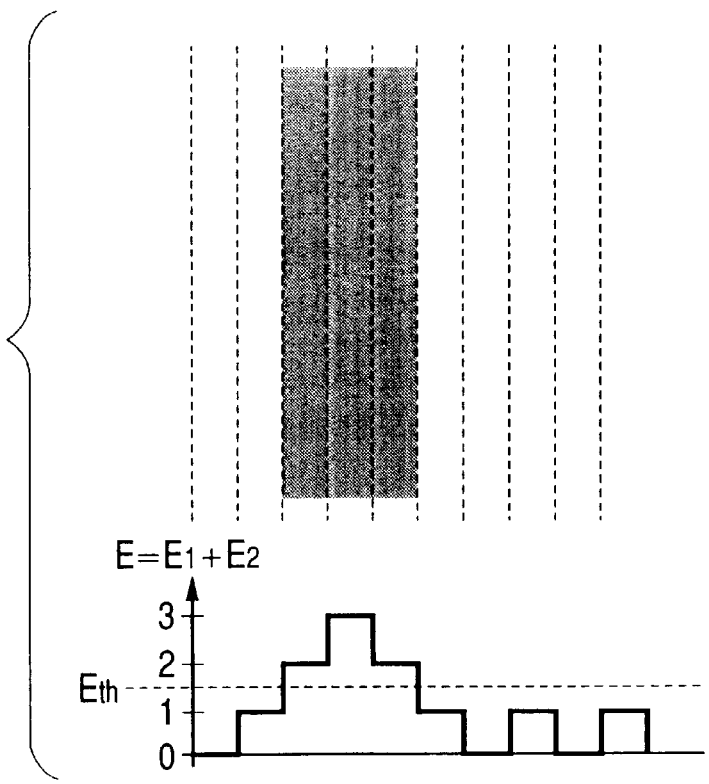

The same principle as in the case of FIGS. 10A and 10B is also applicable to the case of the exposure pattern as illustrated in FIGS. 11A and 11B in a linewidth that can be resolved with a high contrast, equal to three times that of the exposure pattern of FIG. 7, and to cases of exposure patterns in linewidths equal to four and more times. Therefore, in the double exposure method for carrying out the normal exposure with a mask having a plurality of patterns of different linewidths so as to create the exposure pattern of FIG. 7 and the exposure patterns of FIGS. 10A, 10B and FIGS. 11A, 11B, the linewidths of the lithography pattern finally obtained can be defined correctly, so that a variety of lithography patterns that can be implemented by the projection exposure can be formed by the double exposure method of the present embodiment.

By adjusting the exposure dose distributions (absolute values and distributions) of the periodic pattern exposure of the image with the high contrast and the normal exposure comprising the image with the low contrast and the threshold Eth of the resist of the photosensitive substrate as described above, the circuit pattern can be formed in combination of the various patterns as illustrated in FIG. 8, FIG. 9B, FIG. 10B, and FIG. 11B and in the minimum linewidth (resolution) equivalent to approximately that of the periodic pattern exposure (the pattern of FIG. 9B).

The principle of the double exposure method of the present embodiment is summarized below.

1. The exposure pattern by the periodic pattern where the normal exposure (projection exposure) is not effected and the maximum exposure dose is not more than the exposure threshold Eth of the resist, is not developed.
2. At exposure pattern areas (exposure positions) of the normal exposure carried out at the exposure dose not more than the exposure threshold Eth of the resist, the exposure pattern is formed in the resolution of the periodic pattern exposure determined by the combination of the exposure patterns of the normal exposure and periodic pattern exposure.
3. At exposure pattern areas of the normal exposure carried out at the exposure dose not less than the exposure threshold Eth of the resist, fine patterns that are not resolved by illumination only of the projection exposure are also formed similarly (corresponding to the mask).

A further advantage of the double exposure method of the present embodiment is that a far greater depth of focus than that by the exposure of the periodic pattern by the normal projection exposure can be obtained by carrying out the periodic pattern exposure necessitating the highest resolution by the two-beam interference exposure.

In the above description the order of the periodic pattern exposure and the normal exposure is one to carry out the periodic pattern exposure first, but the order may be reverse or they may be carried out simultaneously.

The present embodiment permits the fine and complex pattern, which was unable to be resolved before, to be formed by the double exposure method.

Namely, the present embodiment implements an exposure method of exposing a resist by images of patterns of a mask having a plurality of patterns images of which have respective contrasts different from each other, wherein an image forming position of a pattern an image of which has a low contrast, out of the patterns of the mask, is exposed by an image with a higher contrast than that of the image of the pattern with the low contrast, thereby enhancing a contrast of an exposure dose distribution concerning the pattern with the low contrast. In addition, the exposure method using the resist of the present invention may also be an exposure method of exposing a resist by an image of a pattern of a mask, using a certain radiation, wherein an image with a higher contrast than that of the image of the pattern is formed by a radiation having the same wavelength as the aforementioned radiation, and an image forming position of the pattern of the resist is exposed by this image with the higher contrast, thereby enhancing a contrast of an exposure dose distribution concerning the pattern of the resist, so that a finer pattern can be obtained. The exposure method using the resist of the present invention may also be an exposure method of exposing a resist by an image of a pattern of a mask, wherein an image with a higher contrast than that of the image of the pattern is formed without using the mask, and an image forming position of the pattern of the resist is exposed by this image with the higher contrast, thereby enhancing a contrast of an exposure dose distribution concerning the pattern of the resist, whereby the production cost of the mask can be reduced.

The exposure method using the resist of the present invention may also be an exposure method of carrying out double exposures at the same exposure wavelength by a periodic pattern exposure for carrying out exposure with a periodic pattern formed by interference of two beams or the like and a normal exposure for carrying out normal exposure with a mask having a pattern of a linewidth not more than a resolving power of an exposure apparatus used, so that the production process is simplified and the production cost is thus reduced.

EXAMPLES

The preferred embodiments of the present invention will be described below in greater detail by giving Examples.

Example 1

(Synthesis of Monomer 1)

Into a flask having a Dean-Stark trap cooling pipe, a toluene solution of vinyl acetate and cyclohexanol was charged, and was kept at 120° C. in an oil bath with stirring. Boron trifluoride diethyl ether acetate was added to the solution, and this solution was refluxed to continue the reaction until the water in the trap came not to increase any longer. After the reaction was completed, the reaction mixture was left to cool and water was added thereto, followed by extraction with ether. The extract obtained was washed with a saturated aqueous sodium chloride solution and thereafter dried with magnesium sulfate, which was then concentrated under reduced pressure, followed by distillation of the residue to effect purification.

(Synthesis of Monomer 2)

In a pressure reaction vessel, 2-t-butoxycarbonyl-5-norbornene was synthesized by Diels-Alder reaction of t-butyl acrylate with cyclopentene.

(Synthesis of Sulfur Dioxide Copolymer)

Into a pressure glass ample, azoisobutyronitrile and the above monomers were charged. This reaction vessel was immersed in dry-ice methanol. After it was cooled, sulfur dioxide was liquefied in the reaction vessel by distillation. After the reaction vessel was hermetically closed, its temperature was gradually raised in a thermostatic chamber to control the reaction temperature to 40° C.

After the reaction was completed, the pressure reaction vessel was again cooled to −15° C. or below in dry-ice methanol, and an empty pressure glass tube having been evacuated was connected to the pressure reaction vessel. This was cooled with dry-ice methanol. After the valve of the pressure reaction vessel was opened, the reaction vessel was left in a room-temperature environment, and unreacted sulfur dioxide was gradually vaporized to liquefy the sulfur dioxide in the empty pressure glass tube which was being cooled, and collect it.

After the sulfur dioxide was well removed, acetone was added into the reaction vessel to dissolve the polymer formed. The acetone solution of this polymer was precipitated in methanol little by little, followed by filtration and drying to obtain a solid of the polymer. The procedure of these dissolution, precipitation, filtration and drying was repeated to purify the polymer to obtain a product having a structure represented by the following formula.

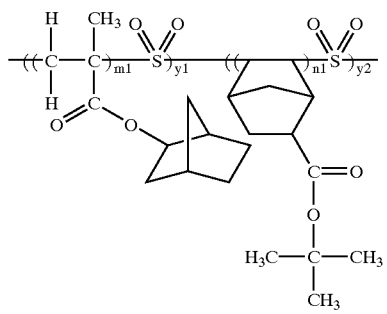

Example 2

(Preparation of Resist 1)

The polymer obtained in Example 1 was dissolved in propylene glycol monomethyl ether acetate in a concentration of 5%. The solution was filtered with a filter of 0.1 µm in pore size.

Example 3

(Preparation of Resist 2)

0.25 g of triphenylsulfonium hexafluoroantimonate as a photo-acid-generator (photoacid generator) and 5 g of the polymer obtained in Example 1 were dissolved in 100 ml of propylene glycol monomethyl ether acetate. The solution was filtered with a filter of 0.1 µm in pore size.

Example 4

(Preparation of Resist 3)

30 g of cresol novolak resin and 1.5 g of the polymer obtained in Example 1 were dissolved in 100 ml of propylene glycol monomethyl ether acetate. The solution was filtered with a filter of 0.1 µm in pore size.

Example 5

(Preparation of Resist 4)

0.08 g of triphenylsulfonium hexafluoroantimonate as a photo-acid-generator, 30 g of polyvinyl phenol and 1.5 g of the polymer obtained in Example 1 were dissolved in 100 ml of propylene glycol monomethyl ether acetate. The solution was filtered with a filter of 0.1 µm in pore size.

Example 6

(Preparation of Resist 5)

30 g of polyglutaraldehyde (a polymer having an alicyclic group) and 1.5 g of the polymer obtained in Example 1 were dissolved in 100 ml of propylene glycol monomethyl ether acetate. The solution was filtered with a filter of 0.1 µm in pore size.

Example 7

(Preparation of Resist 6)

0.08 g of triphenylsulfonium hexafluoroantimonate as a photo-acid-generator, 30 g of ethyl cellulose (a polymer having an alicyclic group) and 1.5 g of the polymer obtained in Example 1 were dissolved in a mixed solvent of 80 ml of propylene glycol monomethyl ether acetate and 20 ml of methyl isobutyl ketone. The solution was filtered with a filter of 0.1 µm in pore size.

Example 8

(Preparation of Resist 7)

0.08 g of triphenylsulfonium hexafluoroantimonate as a photo-acid-generator, 30 g of polyparahydroxysilsesquioxane (an alkali-soluble polymer having silicon elements) and 1.5 g of the polymer obtained in Example 1 were dissolved in a mixed solvent of 80 ml of propylene glycol monomethyl ether acetate and 20 ml of methyl isobutyl ketone. The solution was filtered with a filter of 0.1 µm in pore size.

Example 9

The resist obtained in Example 2 was spin-coated on a silicon wafer, in a film thickness of 0.3 µm. Then, a pattern was drawn at an accelerating voltage of 10 kV by means of an electron-beam drawing apparatus, followed by development with isoamyl acetate to form a resist pattern of 0.2 µm in line width.

Example 10

The resist obtained in Example 3 was spin-coated on a silicon wafer, in a film thickness of 0.7 µm. Then, a pattern on a mask was transferred by means of an exposure apparatus making use of an argon fluoride excimer laser as a light source, followed by development with an aqueous 2.38% tetramethylammonium hydroxide solution to form a resist pattern of 0.18 µm in line width.

Example 11

The resist obtained in Example 4 was spin-coated on a silicon wafer, in a film thickness of 0.4 µm. Then, a tantalum pattern on a mask was transferred through an X-ray mask by means of an X-ray exposure apparatus, followed by development with an aqueous 2.38% tetramethylammonium hydroxide solution to form a resist pattern of 0.15 µm in line width.

Example 12

The resist obtained in Example 5 was spin-coated on a silicon wafer, in a film thickness of 0.7 µm. Then, a pattern on a mask was transferred by means of an exposure apparatus making use of a krypton fluoride excimer laser as a light source, followed by development with an aqueous 2.38% tetramethylammonium hydroxide solution to form a resist pattern of 0.2 µm in line width.

Example 13

The resist obtained in Example 7 was spin-coated on a silicon wafer, in a film thickness of 0.7 µm. Then, a pattern on a mask was transferred by means of an exposure apparatus making use of a krypton fluoride excimer laser as a light source, followed by development with an aqueous 2.38% tetramethylammonium hydroxide solution to form a resist pattern of 0.2 µm in line width.

Example 14

A resist composed chiefly of nonolakresin or a resist composed chiefly of novolak resin and naphthoquinone diazide was spin-coated on a silicon wafer, in a film thickness of 0.7 μm, followed by hard baking. On this coating, the resist obtained in Example 8 was spin-coated in a film thickness of 0.2 μm. Then, a pattern on a mask was transferred by means of an exposure apparatus making use of a krypton fluoride excimer laser as a light source, followed by development with an aqueous 2.38% tetramethylammonium hydroxide solution to form a resist pattern of 0.2 μm in line width. The novolak type resist was further processed by reactive ion etching using oxygen gas, thus the 0.2 μm pattern formed of the upper-layer resist was faithfully transferred to the lower-layer resist.

Example 15

The resist obtained in Example 2 was spin-coated on a silicon wafer, in a film thickness of 0.5 μm. Then, a pattern was drawn with a proton beam, followed by development with amyl acetate to form at an exposure dose of $6 \times 10^{-8}$ C/cm$^2$ a resist pattern of 0.15 μm in line width.

Example 16

A working example is given below on a process for producing a semiconductor device (semiconductor element) by using the resist composition described above.

FIG. 1 is a flow chart of the production of semiconductor devices (such as semiconductor chips of ICs and LSIs, liquid-crystal display panels, and CCDs). In the present Example, Step 1 (circuit design) is taken to perform circuit design of a semiconductor device. In Step 2 (mask formation), a mask having a circuit pattern thus designed is prepared. Meanwhile, in Step 3 (wafer production), wafers are prepared using a material such as silicon. Step 4 (wafer processing) is called a pre-step, where an actual circuit is formed on each wafer by lithography, using the above mask and wafer prepared.

A reticle is transported, and is chucked on a reticle chuck. Next, a silicon wafer substrate coated with the resist of the present invention is loaded in an exposure apparatus. Data for global alignment is read with an alignment unit, and a wafer stage is driven in accordance with the results of measurement, where exposure is successively carried out at predetermined positions.

The next Step 5 (assembly) is called a post-step, and is a step where semiconductor chips are made up on the wafer prepared in Step 4 and which involves assembly steps (dicing and bonding) and a packaging step (chip encapsulation).

In Step 6 (inspection), semiconductor devices fabricated in Step 5 are inspected by an operation check test, a durability test and so forth. Through these steps, semiconductor devices are completed, which are then shipped (Step 7).

Figure 2:
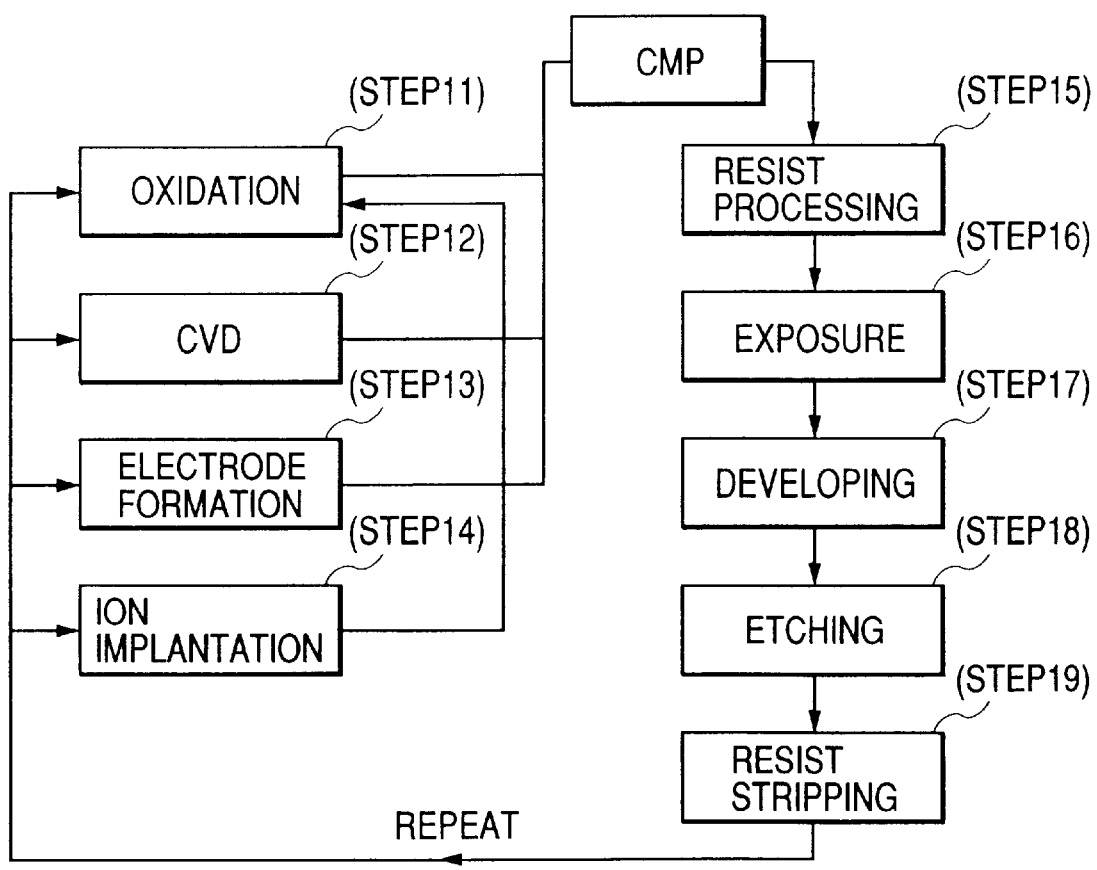
FIG. 2 is a detailed flow chart of the wafer process in the step 4 shown in FIG. 1.
Figure 3:
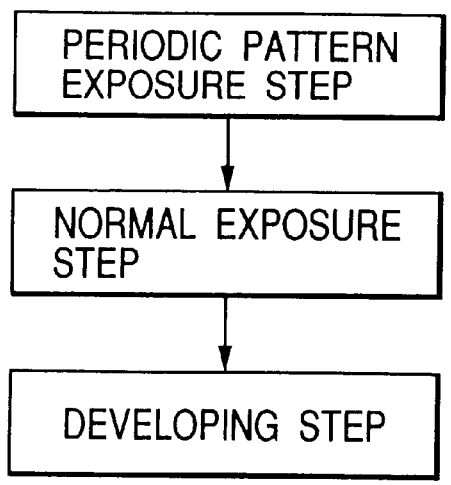
FIG. 3 is a flow chart for illustrating the exposure method employing a resist of the present invention.
Figure 5:
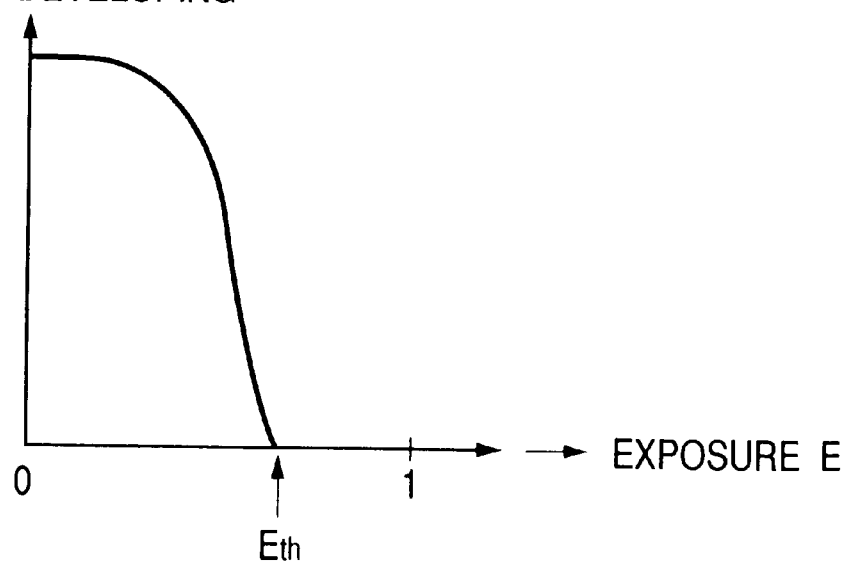
FIG. 5 is a graph showing exposure sensitivity characteristics of a resist.
Figure 4A:
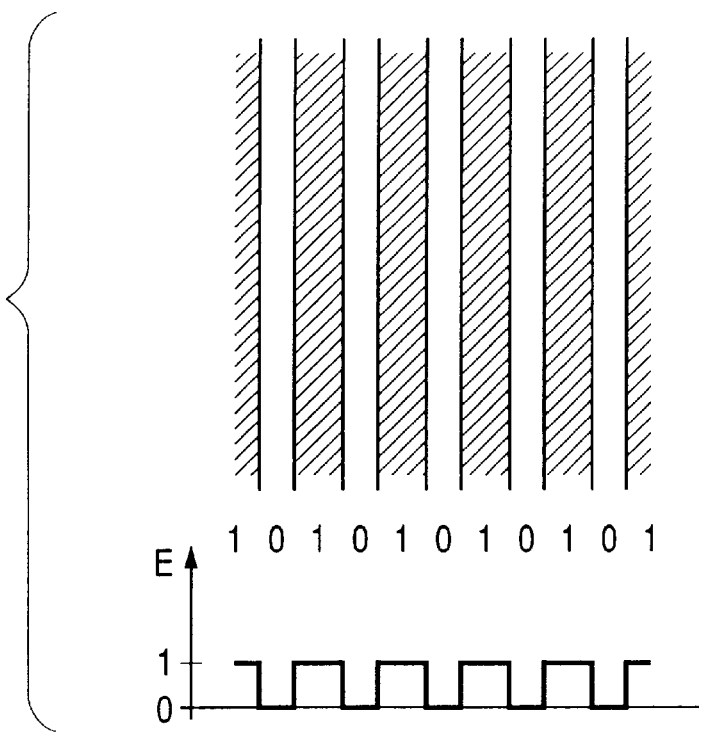
FIGS. 4A and 4B illustrate a periodic pattern (exposure pattern) obtained by two-beam interference exposure.
Figure 4B:
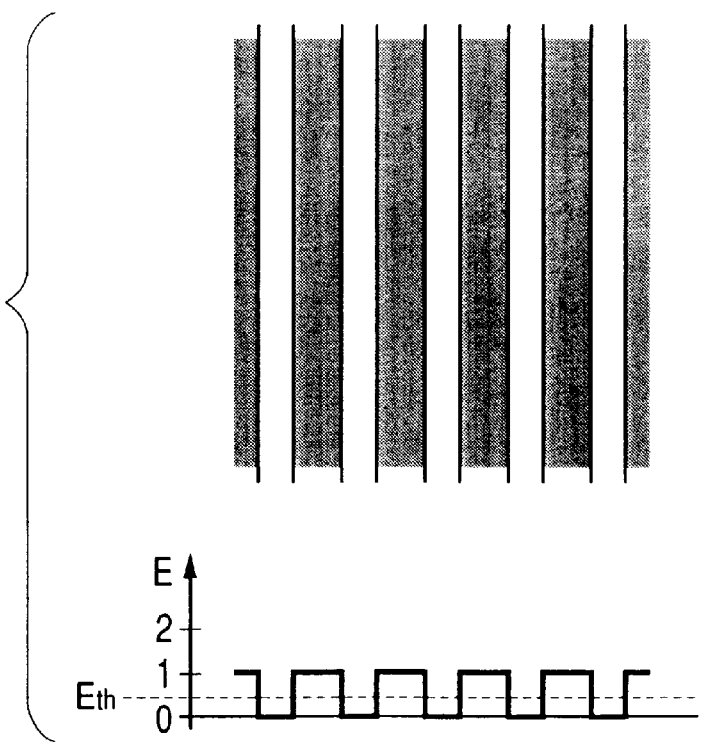

FIG. 2 is a detailed flow chart of the wafer process in Step 4 described above. First, in Step 11 (oxidation), the surface of the wafer is oxidized. In Step 12 (CVD), an insulating film is formed on the wafer surface.

In Step 13 (electrode formation), electrodes are formed on the wafer by vacuum deposition. In Step 14 (ion implantation), ions are implanted into the wafer. Then, the wafer is polished by CMP (chemical mechanical polishing) to flatten its surface, and on this wafer surface the resist composition of the present invention is coated in Step 15 (resist processing).

In Step 16 (exposure), the circuit pattern of the mask is printed on the wafer and exposed by means of the exposure apparatus described previously.

In Step 17 (developing), the resist on the wafer thus exposed is developed. In step 18 (etching), portions other than the developed resist are removed. In Step 20 (resist stripping), the resist is stripped off.

These steps are repeated to form a multiple circuit pattern on the wafer.

As described above, according to the present invention, highly integrated semiconductor devices which have ever been fabricated with difficulty can be fabricated with ease.

What is claimed is:

1. A photosensitive resin having at least three moieties in a backbone chain thereof, one moiety of said at least three moieties being a vinyl monomer moiety, and, two moieties of said at least three moieties being an alicyclic group moiety and a sulfonyl moiety,
   wherein the vinyl monomer moiety has an alicyclic group in the side chain.

2. The photosensitive resin according to claim 1, which has a structure represented by the following chemical formula:

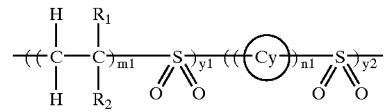

wherein R$_1$ represents a hydrogen atom, a methyl group or a halogen atom; R$_2$ has an alicyclic group; Cy represents a monocyclic or polycyclic alicyclic group; and m1, n1, y1 and y2 each represent a positive real number.

3. The photosensitive resin according to claim 1, which has at least a functional group that is cleavable by an acid.

4. The photosensitive resin according to claim 3, which has the functional group that is cleavable by an acid, on at least one side chain of the vinyl monomer moiety and the alicyclic group moiety bonded to the backbone chain.

5. A resist composition comprising the photosensitive resin according to claim 1, and a solvent for dissolving the photosensitive resin.

6. A pattern formation method comprising the steps of:
   coating the resist composition according to claim 5, on the surface of a substrate to form a resist film;
   exposing the resist film to light; and
   developing the resist film thus exposed.

7. A device produced by the pattern formation method according to claim 6.

8. A resist composition comprising the photosensitive resin according to claim 1, a compound capable of generating an acid upon irradiation by electromagnetic waves or charged particles, and a solvent for dissolving the photosensitive resin and the acid-generating compound.

9. An exposure method comprising exposing a resist by images of patterns of a mask having a plurality of patterns whose images have a contrast different from one another, wherein;

a resist comprising the photosensitive resin according to claim 1 is used as the resist; and an image-forming position of a pattern with a low contrast out of the images of the patterns of the mask is exposed by an image with a contrast higher than that of the image of the pattern with a low contrast, thereby enhancing a contrast of an exposure dose distribution concerning the pattern with a low contrast.

10. An exposure method comprising exposing a resist by an image of a pattern of a mask, to a radiation, wherein;

a resist comprising the photosensitive resin according to claim 1 is used as the resist; and an image with a contrast higher than that of the image of the pattern is formed with a radiation having the same wavelength as the radiation and an image-forming position of the pattern of the resist is exposed by the image with a higher contrast, thereby enhancing a contrast of an exposure dose distribution concerning the pattern with a low contrast.

11. An exposure method comprising exposing a resist by an image of a pattern of a mask, wherein;

a resist comprising the photosensitive resin according to claim 1 is used as the resist; and an image with a contrast higher than that of the image of the pattern is formed without using the mask and an image-forming position of the pattern of the resist is exposed by the image with a higher contrast, thereby enhancing a contrast of an exposure dose distribution concerning the pattern with a low contrast.

12. An exposure method comprising exposing a resist, using the resist comprising the photosensitive resin according to claim 1, and by double exposure carried out at a single exposure wavelength by periodic exposure where exposure is carried out by a periodic pattern formed by interference of two beams and normal exposure where exposure is normally carried out using a mask having a pattern of a line width not more than a resolving power of an exposure apparatus used.

13. A resist composition comprising at least one of the photosensitive resins according to claim 1, an alkali-soluble resin, and a solvent for dissolving the photosensitive resin and the alkali-soluble resin.

14. The resist composition according to claim 13, wherein the alkali-soluble resin is novolak resin or polyvinyl phenol resin.

15. The resist composition according to claim 13, wherein the alkali-soluble resin is a silicon-containing polymer.

16. The resist composition according to claim 13, wherein the alkali-soluble resin has an alicyclic group.

17. The resist composition according to claim 16, wherein the alkali-soluble resin having an alicyclic group is a cellulose derivative.

18. The resist composition according to claim 16, wherein the alkali-soluble resin having an alicyclic group is a polyglutaraldehyde derivative.

19. A resist composition comprising:

a photosensitive resin having at least three moieties in a backbone chain thereof, two moieties of said at least three moieties being an alicyclic group moiety and a sulfonyl moiety;

an alkali-soluble resin; and a solvent for dissolving the photosensitive resin and the alkali-soluble resin, wherein the alkali-soluble resin is a polyglutaraldehyde derivative having an alicyclic group.

20. A resist composition comprising:

a photosensitive resin having at least three moieties in a backbone chain thereof, two moieties of said at least three moieties being an alicyclic group moiety and a sulfonyl moiety;

an alkali-soluble resin; and a solvent for dissolving the photosensitive resin and the alkali-soluble resin, wherein the alkali-soluble resin is a silicon-containing polymer.

* * * * *

UNITED STATES PATENT AND TRADEMARK OFFICE
CERTIFICATE OF CORRECTION

PATENT NO.   : 6,479,212 B1
DATED        : November 12, 2002
INVENTOR(S)  : Minoru Matsuda et al.

It is certified that error appears in the above-identified patent and that said Letters Patent is hereby corrected as shown below:

Column 2,
Line 45, "further has" should read -- further have --;
Line 62, "has a" should read -- has an --; and
Line 65, "the both" should read -- both of the --.

Column 13,
Line 33, "patterns images" should read -- pattern images --.

Column 14,
Line 64, "these dissolution" should read -- this dissolution --.

Column 18,
Line 66, "wherein;" should read -- wherein, --.

Column 19,
Line 10, "wherein;" should read -- wherein, --; and
Line 21, "wherein;" should read -- wherein, --.

Signed and Sealed this

Nineteenth Day of August, 2003

JAMES E. ROGAN
*Director of the United States Patent and Trademark Office*